Aug. 31, 1965 R. E. HARRIS 3,203,840

DIFFUSION METHOD

Filed Dec. 14, 1961

RONALD E. HARRIS
INVENTOR.

BY John G. Graham

United States Patent Office 3,203,840 Patented Aug. 31, 1965

3,203,840
DIFFUSION METHOD
Ronald Eugene Harris, Dallas, Tex., assignor to Texas Instruments Incorporated, Dallas, Tex., a corporation of Delaware
Filed Dec. 14, 1961, Ser. No. 159,215
5 Claims. (Cl. 148—187)

The present invention relates to a method of selectively diffusing an impurity into a semiconductor, and more particularly relates to a method of selectively diffusing an impurity into silicon.

The alteration of the electrical characteristics of a semiconductor and the formation of rectifying junctions therewithin by the method of impurity diffusion to form useful devices is well established as being of prime importance in the semiconductor art. However, various controls over this method must be exercised to insure its efficiency. For example, the depth to which an impurity is diffused into a semiconductor must be accurately controlled. Moreover, impurity diffusions must, in most cases, be restricted to predetermined regions within a semiconductor body to produce the desired results. That is, the impurity diffsion must be restricted to only a portion of the surface of the semiconductor body, thus restricting the impurity diffusion to predetermined regions within the body.

In the silicon transistor art, various masking means are used for restricting impurity diffusion to predetermined regions within a silicon body, the most useful means being a silicon dioxide mask. By providing a silicon dioxide layer on the surface of a silicon body and removing selected portions of the layer, an impurity can be diffused through the openings provided in the silicon dioxide layer and into the silicon body, whereas the diffusion of the impurity is blocked at the surface by the silicon dioxide that was not removed. Since most donor and acceptor impurities that can be used with silicon have very low diffusion rates in silicon dioxide, the latter is an effective mask against the diffusion of an impurity therethrough. However, there are exceptions, of which gallium is one, whose diffusion rate in silicon dioxide is very high, making them difficult to utilize since silicon dioxide is not an effective mask against the diffusion therethrough. Because of the desirable properties imparted to silicon by using gallium as an impurity therein, it is equally desirable to provide a method whereby the diffusion into silicon of those impurities having high diffusion rates in silicon dioxide can be selectively masked. Moreover, it is desirable that this method of masking be equally applicable to all other donor and acceptor impurities used with silicon.

It is therefore an object of this invention to provide a method of selectively diffusing an impurity into a semiconductor.

It is another object of the invention to provide a method of selectively diffusing an impurity into silicon.

Yet another object of the invention is to provide a method whereby the diffusion into silicon of those impurities having a high diffusion rate in silicon dioxide can be selectively masked.

It is another object of the invention to provide a method of selectively diffusing gallium into silicon.

Other objects, advantages and features of the invention will readily become apparent from the following detailed description when taken in connection with the appended claims and the attached drawing in which like reference numerals refer to like parts throughout, and in which:

Figures 1, 2, 3, 4:
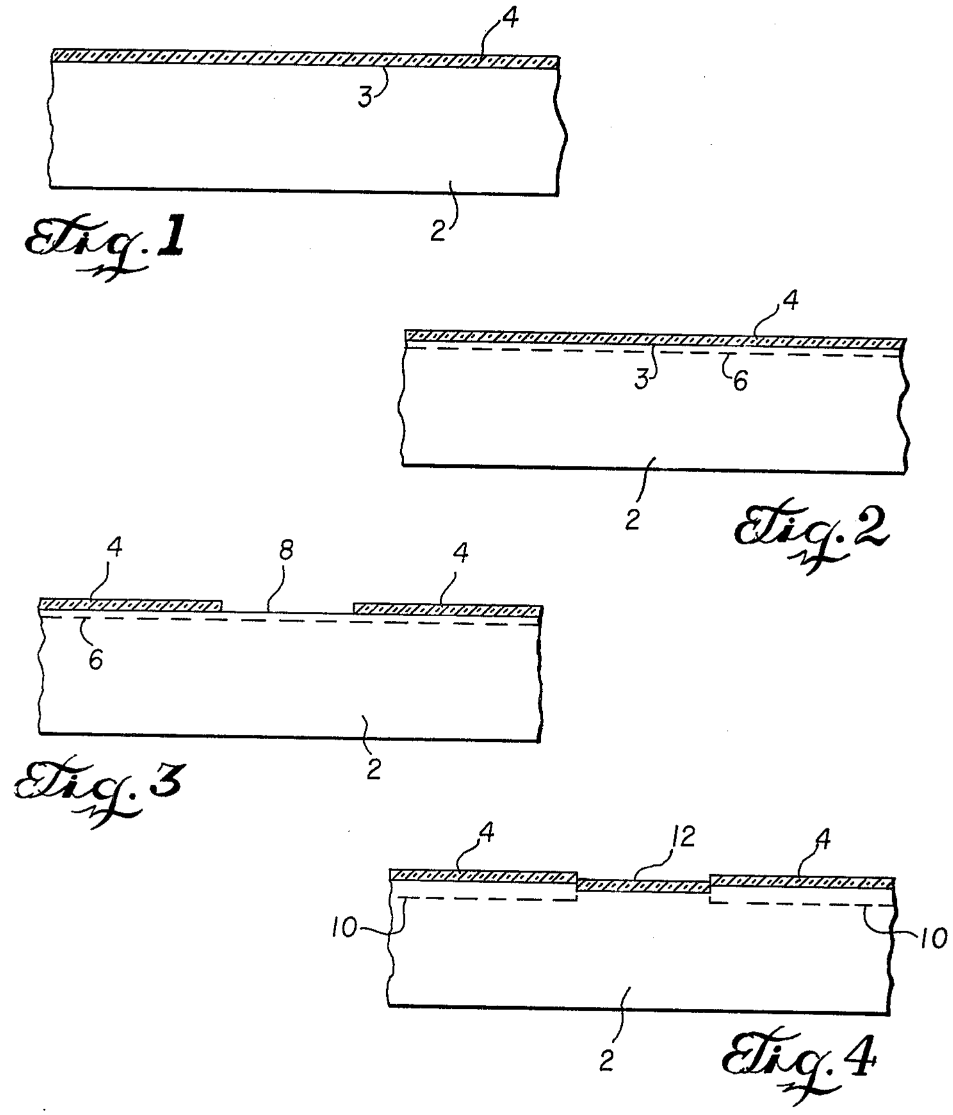
FIGURE 1 is an enlarged sectional view in elevation (partly cut away) of a silicon wafer having a layer of silicon dioxide on one of its surfaces.
FIGURE 2 is a view of the silicon wafe shown in FIGURE 1 after a conductivity type determining impurity has been diffused into the wafer to establish a concentration of the impurity adjacent the surface having the silicon dioxide layer.
FIGURE 3 is a view of the silicon wafer shown in FIGURE 2 with a portion of the silicon dioxide removed.
FIGURE 4 is a view of the silicon wafer shown in FIGURE 3 after the second step of the method of the invention has been carried out.

According to the invention a concentration of an impurity is established adjacent a surface of a wafer of silicon in any conventional manner, such as by a diffusion of the impurity from a vapor phase into the silicon. Reasonable care is exercised to limit the depth in the silicon to which the impurity diffuses. Since silicon does not have a high enough vapor pressure at normal diffusion temperatures (900° C.–1200° C.) under atmospheric pressure to cause appreciable evaporation of silicon atoms, the concentration of impurity established adjacent the surface of the silicon body will be approximately equal to the solid solubility of the impurity in the silicon at the specific diffusion temperature. In addition, silicon dioxide is provided over a selected portion of the surface of the silicon body. For certain impurities, gallium being one example, the silicon dioxide layer is provided on the surface of the wafer before the impurity concentration is established adjacent that surface, whereas for other impurities, boron being one example, the silicon dioxide layer is provided on this surface subsequent to the impurity concentration's being established adjacent the surface, all as explained hereinafter. And as will also be described hereinafter in the two illustrative examples, the method for providing the silicon dioxide layer differs for different impurities used. Once a silicon dioxide layer has been provide over a selected portion of the surface of the wafer, a second diffusion step is carried out. This is accomplished by placing the silicon wafer in a furnace in the presence of a steam atmosphere and heating the wafer to a temperature in the range of 900° C.–1300° C., the particular temperature used being compatible with the particular impurity used. Because of the wet atmosphere, that portion of the surface of the wafer not provided with a silicon dioxide layer is vigorously oxidized, thus forming a layer of silicon dioxide over that portion of the surface. It should be noted that the newly formed silicon dioxide results from the conversion of some of the silicon atoms in the exposed surface of the wafer into the silicon dioxide. As will be discussed hereinafter, the duration of this heating step and the oxidizing temperature used is dependent upon the particular impurity used.

As a result of the oxidation of the exposed portion of the wafer, the impurity adjacent this exposed surface is "trapped" in the newly formed silicon dioxide layer. For all practical purposes, the impurity is removed and is precluded from diffusing into the silicon wafer. If desired, the silicon dioxide can then be removed from the entire surface of the silicon wafer, and another diffusion step can subsequently be carried out, whereby the impurities adjacent the selected portion of the surface of the wafer can be further diffused into the body. The foregoing sequence of steps thus provides a method of effectively masking the silicon body from impurity diffusion in selected areas.

The method by which gallium can be diffused into selected areas of a silicon wafer will be described in detail as the preferred embodiment of the invention, the description being with reference to FIGURES 1 through 5. Referring specifically to FIGURE 1, there is shown a side sectional view of a portion of a silicon wafer 2 provided with a silicon dioxide layer 4 on one surface 3 thereof. The silicon wafer 2 may be of any desired thickness but is usually a few mils thick. The silicon dioxide layer 4 may be provided on the surface 3 of the silicon wafer by any conventional method. For example, heating the silicon wafer to a temperature of about 1200° C. in the presence of steam for a few hours is sufficient to form the silicon dioxide layer. As one specific example, the heating of the silicon wafer to about 1200° C. for about two hours in the presence of steam will produce a silicon dioxide layer of a thickness of about 13000 angstrom units (plus or minus 1000 or 2000 angstrom units). It should be noted that this thickness is not critical but is preferably a few thousands angstrom units.

After the silicon dioxide layer 4 is provided on the surface of the silicon wafer, gallium, a P-type conductivity determining impurity in silicon, is diffused through the silicon dioxide layer 4 and to a slight depth into the surface of the silicon wafer 2. Since the diffusion rate of gallium in silicon dioxide is very high, the layer 4 does not effectively impede the diffusion of the gallium therethrough. As one example, the silicon wafer is heated to about 1000° C. for approximately 30 minutes in the presence of a mixture of dry hydrogen and the vapor of gallium trioxide. This simple diffusion process will provide a concentration of gallium atoms adjacent the surface of the silicon wafer of about $2\times10^{19}$ gallium atoms per cubic centimeter, this being approximately the solid solubility of gallium in silicon at 1000° C. For the conditions given, the depth of the gallium penetration in the silicon will be about 2000–3000 angstrom units. The depth to which the gallium atoms are diffused in the silicon wafer is represented by the dotted line 6 in FIGURE 2, and the silicon between the dotted lines 6 and the surface 3 is converted to P-type conductivity. Although, theoretically, the gallium atoms diffuse throughout the thickness of silicon wafer 2, for all practical purposes, the gallium is concentrated between the surface 3 and the depth 6, thereby forming a rectifying junction somewhere in the region of the line 6.

For making conventional semiconductor devices it is frequently desirable to diffuse the impurity (gallium) to a greater depth into the silicon wafer 2 than is represented by the depth 6. Moreover, it is frequently desirable that only certain portions of the silicon wafer be diffused with the impurity atoms, some expedient thus being required to mask the other portions so that they are free from impurity diffusion. As shown in FIGURE 3, a portion of the silicon dioxide layer 4 is removed to expose a portion of the surface of the wafer designated by the numeral 8. Any desired pattern of silicon dioxide may be removed from this surface, this being accomplished by any conventional method. For example, a layer of photographic emulsion can be provided over the entire surface of the silicon dixoide layer 4. The emulsion is then selectively exposed to light to provide a desired pattern, is subsequently developed, and the unexposed portion is removed by the developer. The portion of the silicon dioxide not protected by the developed emulsion is then etched. The developed emulsion can then be removed by a solvent, leaving the remaining silicon dioxide layer 4 intact as shown in FIGURE 3. Thus the surface of the silicon wafer in the region designated by reference numeral 8 is exposed.

The silicon wafer 2 is then placed in some suitable furnace of conventional design and heated to an elevated temperature in the presence of steam. The purpose of this step is to vigorously oxidize the exposed surface portion 8 of the silicon wafer 2. For example, heating the silicon wafer to about 1000° C. in the presence of steam for about 2 hours is sufficient to cause the exposed surface 8 of the silicon wafer to oxidize and form a silicon dioxide layer of about 6000 angstrom units thick. As will be described hereinafter, the rate of formation of the silicon dioxide on the surface of the wafer is governed by certain parameters, but for present explanatory purposes, a silicon dioxide layer 12 is formed at the exposed surface 8 of the wafer 2 as shown in FIGURE 4. As is shown in the sectional view of FIGURE 4, the gallium adjacent the exposed surface 8 of the silicon wafer is "trapped" in the silicon dioxide layer 12, indicated by the absence of a dotted line beneath this layer. The gallium beneath the remaining silicon dioxide layer 4 is driven to a slightly greater depth during the formation of the oxide layer 12, as represented by the reference numeral 10.

Figure 5:
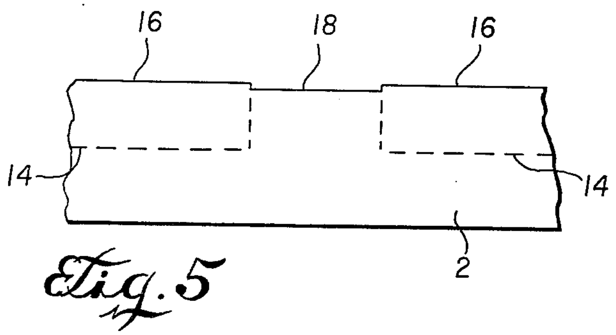
FIGURE 5 is a view of the silicon wafer shown in FIGURE 4 with the silicon dioxide removed from the surface of the wafer.

As shown in FIGURE 5 the silicon dioxide layers 4 and 12 may be removed from the surface of the silicon wafer and any further diffusion of the gallium atoms into the silicon can be carried out as desired. However, it may be desirable to retain these oxide films to (1) to protect the surface during other high temperature diffusions, and (2) yield better device characteristics than could be achieved by subsequently providing other protective oxide films. Whether these films are removed is therefore seen to depend upon the particular device to be fabricated.

The method of the invention is also applicable to the diffusion of other impurities into silicon. By way of another example, a silicon body may be selectively masked for the diffusion of boron therein. The foregoing sequence of steps is the same when using boron with the exception that the initial layer of silicon dioxide 4 as shown in FIGURE 1 is deposited after the initial diffusion of boron into the surface of the silicon wafer. The reason for this is that boron will not diffuse through silicon dioxide because of the low diffusion rate therein. The sequence of steps for practicing the invention with the diffusion of boron in the silicon is as follows: Boron is diffused to a slight depth in a surface of the silicon wafer. A silicon dioxide layer 4 is then provided on the surface of the wafer without oxidizing the wafer itself. For example, a silicon dioxide layer can be provided on the surface by thermally depositing silicon dioxide from the vapor phase, as for example, by reacting an organic-silicon containing compound in the presence of heat onto the surface of the wafer, this method being fully described in the copending application by K. E. Statham, Serial No. 94,244, filed March 8, 1961. Once a layer of silicon dioxide has been deposited on the surface of the wafer 2, the same sequence of steps as described with reference to FIGURES 3–5 is used to complete the masking for the boron diffusion.

As described in the foregoing illustrative examples, the vigorous oxidation of the exposed surface of the silicon wafer results in the formation of silicon dioxide and the "trapping" therein of the impurity directly therebeneath. The theory governing the "trapping" of the impurity in the thermally grown silicon dioxide layer is thought to be as follows: As the new layer of silicon dioxide is formed the impurity has a tendency to diffuse into the new layer in addition to its tendency to diffuse further into the silicon body. This is a result of the laws of diffusion wherein atoms have a tendency to diffuse from high concentration source to a region of low concentration. In order to provide complete masking in those areas where the new silicon dioxide layer is formed, it is necessary that all of the impurity directly beneath those areas be "trapped" in the new silicon dioxide layer. To predict the effectiveness of the mask, it is therefore necessary to consider the diffusion rates of the impurity in both silicon and silicon dioxide. Moreover, it is necessary to consider the rate of growth of silicon dioxide on the surface of the silicon body. A qualitative discussion of these considerations with respect to gallium and boron is given in the foregoing paragraphs.

For gallium, it is known that its diffusion rate in silicon dioxide is much higher than its diffusion rate in silicon. Moreover, the rate of growth of silicon dioxide falls off less rapidly than does the diffusion rate of gallium in silicon as the temperature is lowered. Thus it is advantageous to utilize a relatively low temperature (900°–1000° C.) in growing the new layer of silicon dioxide in order to reduce the diffusion rate of gallium in silicon without appreciably lowering the rate of growth of the silicon dioxide layer. This permits the silicon dioxide layer to "overtake" the gallium before the gallium can diffuse from the surface and into the silicon body. It should be noted that gallium has a high affinity for silicon dioxide relative to its affinity for silicon, thus yielding the advantage of a coefficient of segregation of the gallium from the silicon to the silicon dioxide of much greater than unity (usually about 1000:1).

Similar considerations hold for boron as an impurity. In this instance the segregation coefficient of boron is about unity (meaning that boron has about an equal effinity for silicon and silicon dioxide), and the diffusion rate of boron in silicon is much higher than the diffusion rate of boron in silicon dioxide. For both boron and gallium, "trapping" of the impurity occurs when the growing oxide film overtakes the impurity, that is, the oxide film grows at a rate faster than the rate of diffusion of the impurity from the surface. The gallium atoms appear to stay "trapped" because of their affinity for the oxide, and the boron atoms appear to stay "trapped" because their diffusion rate therein is too small to permit them to exceed the rate of growth of the oxide layer.

In order that the invention can be utilized to its best advantage, the process of successively removing the newly formed silicon dioxide layer and regrowing a new one can be utilized to completely remove the impurity adjacent the selected portion of the surface. This becomes more apparent when it is understood that the rate of formation of the silicon dioxide layer decreases as a function of its thickness. At least one reason for this is the fact that as the silicon dioxide layer is formed, the wet atmosphere producing the layer can no longer as readily come into contact with the pure silicon, thus allowing the oxidation rate to decrease. By forming a thin layer of silicon dioxide, removing it by selective etching (any conventional techniques known in the art), regrowing another layer and so on, the impurity can be completely removed from the selected regions.

Although the invention has been described with reference to illustrative examples, it is to be understood that certain modifications and substitutions apparent to those skilled in the art will fall within the true scope of the invention as defined by the appended claims.

What is claimed is:

1. The method of selectively diffusing gallium into a silicon body comprising the steps of forming a layer of silicon dioxide on a surface of said body, diffusing gallium through said silicon dioxide and into said body to form a concentration of said gallium within said surface, removing said silicon dioxide from a selected portion of said surface, and subsequently oxidizing said selected portion of said surface.

2. The method of selectively diffusing gallium into a silicon body comprising the steps of oxidizing the surface of said body, diffusing gallium through said oxide and into said body to form a concentration of said fallium within said surface, removing said oxide from a selected portion of said surface, and subsequently reoxidizing said selected portion of said surface.

3. The method of selectively diffusing an impurity into a silicon body comprising the steps of forming a concentration of said impurity within the surface of said body, forming a layer of silicon dioxide over a selected portion of the surface of said body, and subsequently oxidizing the remaining portion of said surface at a rate sufficient to cause the growth of the oxide on said remaining portion of said surface to be greater than the diffusion rate of said impurity in said silicon body.

4. The method as defined in claim 3 wherein said impurity is boron.

5. The method of selectively diffusing gallium into a silicon body comprising the steps of oxidizing the surface of the body, diffusing gallium through said oxide into said body to form a concentration of said gallium within said body, removing said oxide from a selected portion of said surface, and subsequently oxidizing the selected portion of said surface at a rate sufficient to cause diffusion of gallium into said oxide to be greater than the diffusion rate of said gallium in said silicon body.

References Cited by the Examiner

UNITED STATES PATENTS

| | | | |
|---|---|---|---|
| 2,419,237 | 4/47 | Treuting | 148—1.5 |
| 2,802,760 | 8/57 | Derick et al. | 148—1.5 |
| 2,899,344 | 8/59 | Atalla et al. | 148—1.5 |
| 2,953,486 | 9/60 | Atalla et al. | 148—1.5 |
| 3,066,052 | 11/62 | Howard | 148—187 |

OTHER REFERENCES

A Double Diffused Silicon High-Frequency Switching Transistor produced by Oxide Masking Techniques, Aschner et al., Journal of the Electrochemical Society, May 1959, pages 415–417.

BENJAMIN HENKIN, *Primary Examiner.*

DAVID L. RECK, *Examiner.*